United States Patent [19]
Fukuda et al.

[11] Patent Number: 5,517,942
[45] Date of Patent: May 21, 1996

[54] PROCESS FOR PRODUCING OPTOELECTRIC ARTICLES

[75] Inventors: Tsuguo Fukuda, Sendai; Yasunori Okano, Hamamatsu; Tatsuo Kawaguchi, Nagoya; Minoru Imaeda, Nagoya, all of Japan

[73] Assignee: NGK Insulators, Ltd., Japan

[21] Appl. No.: 408,390

[22] Filed: Mar. 22, 1995

[30] Foreign Application Priority Data

Mar. 25, 1994 [JP] Japan .................................. 6-055612

[51] Int. Cl.$^6$ .................................................. C30B 19/12
[52] U.S. Cl. .............................. 117/64; 117/65; 117/66; 117/67; 117/948
[58] Field of Search ...................... 117/64, 65, 66, 117/67, 948

[56] References Cited

U.S. PATENT DOCUMENTS 5,209,917  5/1993  Ohno et al. ............................. 117/66

FOREIGN PATENT DOCUMENTS

| 0444209 | 9/1991 | European Pat. Off. . | |
|---|---|---|---|
| 299571 | 4/1992 | Germany . | |
| 51-9720 | 3/1976 | Japan | 117/948 |
| 0369586 | 3/1991 | Japan | 117/66 |
| 05155695 | 6/1993 | Japan | 117/66 |
| 05229897 | 9/1993 | Japan | 117/66 |

OTHER PUBLICATIONS

Miyazawa, Shinataro et al., "Optical Waveguide of LiNbO$_3$ Thin Film Grown by Liquid Phase Epitaxy", Applied Physics Letters, vol. 26, No. 1, pp. 8–10, Jan. 1, 1975.

Baudrant, A. et al., "Liquid Phase Epitaxy of LiNbO$_3$ Thin Films for Integrted Optics", Mat. Res. Bull. vol. 10, pp. 1373–1377, Pergamon Press, USA, 1975.

Tamada, Hitoshi et al., "LiNbO$_3$ Thin–Film Optical Waveguide Grown by Liquid Phase Epitaxy and its Application to Second Harmonic Generation", J. Appl. Phys. 70, pp. 2536–2541, Sep. 1, 1991.

Yamada, Atsuo et al. "Liquid Phase Epitaxial Growth of LiNbO$_3$ Thin Film Using Li$_2$O–B$_2$O$_3$ Flux System", Journal of Crystal Growth 132, pp. 48–60, Elsevier Science Publishers, North–Holland, 1993.

Journal of Crystal Growth, "Direct Measurement of Temperature Dependence of Lattice Mismatches Between LPE-–Grown Li(Nb,Ta)O3 Film and LiTaO3 Structure", Sugh et al, pp. 607–614.

Patent Abstracts of Japan, vol. 17, No. 475 (C–1103).

*Primary Examiner*—Robert Kunemund
*Attorney, Agent, or Firm*—Parkhurst, Wendel & Burr

[57] ABSTRACT

A process for producing optoelectric articles, in which an optoelectric single crystal film is formed on an optoelectric single crystal substrate, is disclosed. The optoelectric single crystal substrate is exposed to a liquid phase in a supercooling state of a melt including a solute and a melting medium, and the optoelectric single crystal film is formed by a liquid phase epitaxial process. In this case, a viscosity of the liquid phase is set to 75%–95% preferably 75%–90% with respect to a viscosity at which a degree of supercooling of the liquid phase is zero.

7 Claims, 6 Drawing Sheets

FIG_1

FIG_2

FIG_4a
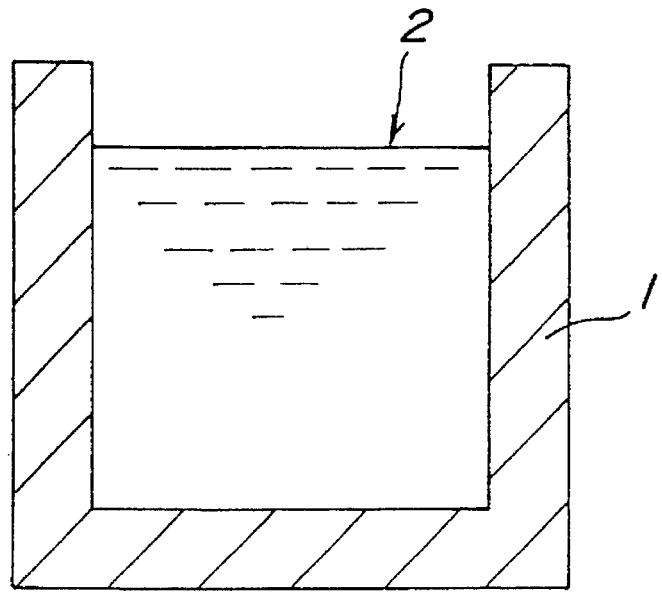
FIG_4b
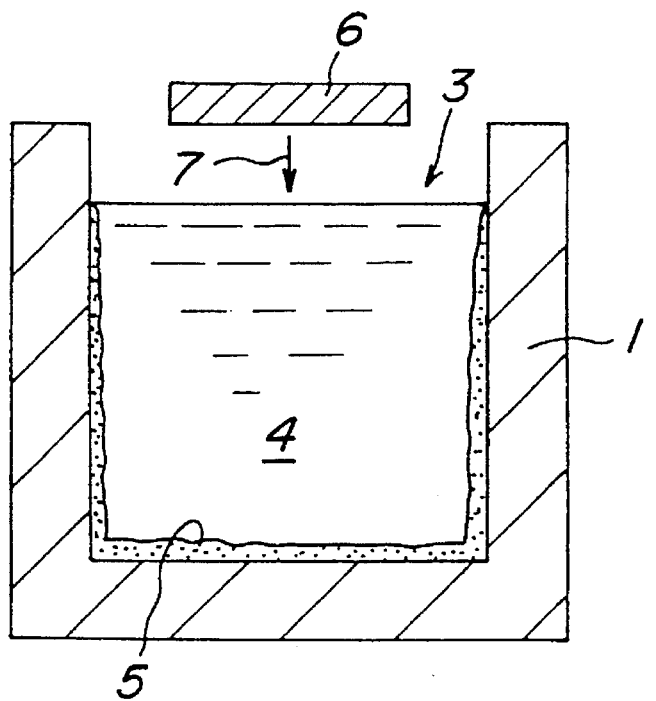

PROCESS FOR PRODUCING OPTOELECTRIC ARTICLES

BACKGROUND OF THE INVENTION

1. Field of the Invention

The present invention relates to a process for producing optoelectric articles.

2. Related Art Statement

The lithium niobate ($LiNbO_3$) single crystals and the lithium tantalate ($LiTaO_3$) single crystals have been expected as materials for optoelectronics. It is known that a thin film of lithium niobate is formed on a substrate made of a single crystal of lithium niobate or the like by the liquid phase epitaxial process.

For example, according to the description in "Appl. Phys. Letters", vol. 26 No. 1 (1975), pp 8–10, a thin film of a single crystal of lithium niobate is formed on a substrate of a single crystal of lithium tantalate by the liquid phase epitaxial process. According to "Mat. Res. Bull", vol. 10 (1975), pp 1373–1377, a thin film of a single crystal of lithium niobate is formed on a substrate of a single crystal of lithium niobate by the liquid phase epitaxial process. According to "J. Appl. Phys.", Vol 70 No. 5 (1991), pp 2536–2541, a thin film of a single crystal of lithium niobate is formed on a substrate of lithium niobate doped with magnesium oxide by the liquid phase epitaxial process.

The film forming method in the liquid phase epitaxial process will be explained. FIG. 5 is a graph schematically illustrating a temperature schedule for a melt in the case of the liquid phase epitaxial process. FIG. 6 is a graph showing a solubility curve of a pseudo-binary system such as $LiNbO_3$-$LiVO_3$. First, lithium niobate (solute) and $LiVO_3$ (solvent) are charged and mixed together. A saturation temperature corresponding to a melt having a charged composition is taken as "$T_0$". While the temperature of the melt is held at $T_1$ higher than the saturation temperature $T_0$, lithium niobate and $LiVO_3$ are uniformly melted. In FIG. 5, "A" corresponds to this molten state. Then, the melt is led to a supercooled state by lowering the temperature of the melt to a temperature $T_4$ lower than the saturation temperature $T_0$. In FIG. 5, "C" corresponds to this supercooled state. The substrate is contacted with the supercooled melt.

Moreover, a crystallinity of the single crystal mentioned above can be estimated by a half width of the X-ray rocking curve According to "J. Cryst. Growth", Vol. 132 (1993), pp 48–60, use is made of a substrate of lithium niobate doped with magnesium oxide, and a thin film of a single crystal of lithium niobate having a substantially same small half width as that of the substrate is formed on the substrate.

Usually, in the process of producing a thin film by the liquid phase epitaxial process, it is important to control a film forming temperature, a film forming time period, a degree of supercooling, and so on so as to control film qualities such as film thickness, crystallinity, surface state, optical properties and so on. For example, as for a film thickness "d" of the single crystal film, the following equation (I) is satisfied.

$$d=(1/Cs \cdot m)(D/\pi)[2\Delta T \cdot t^{0.5}+(4/3)Rt^{1.5}] \mu m \quad (I)$$

where "d" is a film thickness, "Cs" is a density of film, "m" is an inclination of a liquid phase line, "D" is a diffusion constant, "$\Delta T$" is a degree of supercooling, "R" is a cooling rate and "t" is a time. The degree of supercooling (the degree of supersaturation) $\Delta T$ is expressed by $\Delta T$=(saturation temperature—film forming temperature). The saturation temperature is determined by a composition of the melt. Therefore, if a composition of the melt is constant, the saturation temperature is also constant. In this case, $\Delta T$ is directly determined corresponding to the film forming temperature, and thus the film thickness must be constant from the equation (I).

However, in actual cases, if a film is formed at the same film forming temperature, a film thickness is varied. This is recently understood. Moreover, in this case, the other film qualities such as crystallinity, surface state and optical properties are also varied. Therefore, in the case of forming a single crystal film by the liquid phase epitaxial process, it is difficult to form a film having an excellent crystallinity.

The present inventors have further investigated this point. In the liquid phase epitaxial process, a film forming is performed by maintaining the melt at a temperature higher than the saturation temperature, and then cooling the melt to the film forming temperature lower than the saturation temperature so as to subject it to a super cooling skate. A crystallinity of the film is determined by this supercooling state. In the conventional understandings, since the supercooling state is determined by the saturation temperature and the film forming temperature, it is possible to form stably a film having an excellent crystallinity if controlling them.

However, in actual cases, the supercooling state is affected by various factors, and thus a quality of the single crystal film is not constant, even if the saturation temperature and the film forming temperature are maintained constant. For example, if a concentration of solute of the melt is slightly varied, or if a cooling rate from a high temperature to the film forming temperature is varied, the supercooling state is varied drastically, and thus it is not possible to form a film having an excellent crystallinity. Particularly, if a film is repeatedly formed on the substrate during the actual film forming process, the composition of the melt changes with high response. Consequently, it is difficult to keep the concentration of the solute constant. Therefore, it is difficult to form films with high reproducibility.

In particular, the reproducibility becomes poor, with deteriorated crystallinity contrary to the expectation, in a film forming temperature of more than 1000° C. in which the single crystal film having an excellent crystallinity must be inherently formed.

Moreover, single crystal substrates made of lithium niobate are now produced by the Czochralski process. However, in this process, on a single crystal substrate, it is difficult to form a single crystal film having a more excellent crystallinity than that of the single crystal substrate. Consequently, if an optical waveguide substrate, SHG device, and so on are formed on the single crystal film, an optical damage resistivity of the optical waveguide becomes poor, and an energy threshold level of light which can be transmitted through the optical waveguide is low. Therefore, the substrate produced by the Czochralski process is worked to obtain the optical waveguide substrate, and thus the single crystal film produced by the liquid phase epitaxial process is not used effectively for the articles mentioned above. This problem is expected to be solved.

SUMMARY OF THE INVENTION

It is an object of the invention to provide a process for producing optoelectric articles in which, when an optoelectric single crystal film is formed on an optoelectric single crystal substrate, a single crystal film having an excellent crystallinity especially having a more excellent crystallinity than that of the single crystal substrate is formed with high reproducibility.

According to the invention, a process for producing optoelectric articles in which an optoelectric single crystal film is formed on an optoelectric single crystal substrate, comprises the steps of contacting said optoelectric single crystal substrate to a liquid phase in a supercooling state of a melt including a solute and a melting medium, and forming said optoelectric single crystal film by a liquid phase epitaxial process under such a condition that a viscosity of said liquid phase is set to 75%~95% with respect to a viscosity at which a degree of supercooling of said liquid phase is zero.

BRIEF DESCRIPTION OF THE DRAWINGS

For a better understanding of the invention reference is made to the attached drawings, wherein:

FIGS. 4a and 4b are cross sectional views schematically showing the state of the melt in the crucible 1;

DESCRIPTION OF THE PREFERRED EMBODIMENT

Figure 1:
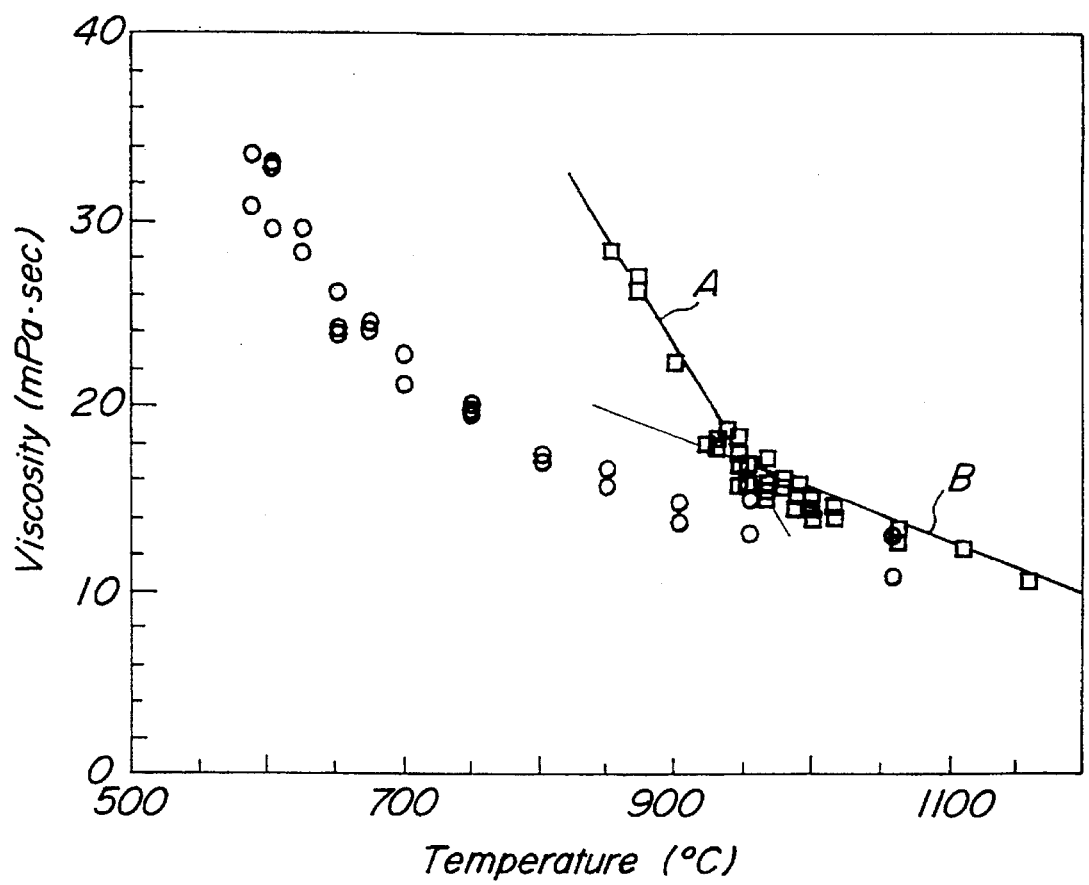
FIG. 1 is a graph showing a relation between temperature and a viscosity with respect to melts of 20 mol % $LiNbO_3$–80 mol % $LiVO_3$ (represented by □) and $LiVO_3$; (represented by ○)

The present invention is achieved on the basis of the present inventor's finding such that, if a cooling rate of the melt to a film forming temperature lower than a saturation temperature is varied, liquid phase properties in a supercooling state are different even when a composition of the melt and a film forming temperature are same.

From experimental results described below, it is understood that this is because the reason such that the supercooling state of the melt is very unstable. Therefore, it is difficult to achieve the same supercooling state of the melt with high reproducibility only by controlling indirect conditions such as a composition of the melt, a film forming temperature, a cooling rate, and so on. Consequently, in the conventional method, it is understood that the single crystal film having an excellent crystallinity can not be formed with high reproducibility. Especially, in the conventional method, since a film is repeatedly formed from the same melt, a solute component to be precipitated is decreased, and a component of the melt is varied. Therefore, the saturation temperature is gradually changed, and thus the supercooling state is varied more largely.

Here, the present inventors investigated a viscosity of the melt, and found the following phenomena, which achieve the present invention.

(1) If the cooling rate, at which a temperature of the melt is cooled down from a high temperature to the film forming temperature lower than the saturation temperature, is different, a viscosity of the melt in the supercooling state differs even when the composition of the melt and the film forming temperature are same.

(2) In the case of making the cooling rate smaller, an increase of the viscosity becomes larger from an approximate saturation temperature. This phenomenon corresponds to a variation from the liquid phase to a mix state in which a gathering compound of the liquid and the solid exist. As the cooling rate is made larger, the temperature, at which an extraordinary increase of the viscosity is detected, is shifted toward a temperature lower than the saturation temperature.

(3) If the melt is maintained at the film forming temperature for a sufficiently long time, a condition of the liquid phase becomes stable. As the cooling rate is made larger, a viscosity at the film forming temperature decreases. In this case, a viscosity of the melt in the supercooling state is larger than that at the saturation temperature.

(4) The supercooling state of the liquid phase is unstable. In this case, if the melt is maintained at the film forming temperature, a viscosity of the melt increases.

(5) If the film is repeatedly formed from the same melt, a viscosity of the melt gradually deceases. This reason is estimated as a decrease of the solute to be precipitated at the film forming temperature. Since an amount of solute actually precipitated on the substrate is very small, this phenomenon affects the viscosity of the melt extraordinarily.

(6) Under the above phenomena, the present inventors think that it is difficult to improve the quality of the single crystal film or to obtain a stable quality of the single crystal film only by controlling the saturation temperature, the film forming temperature and so on indirectly. Therefore, the present inventors tried to control a viscosity of the melt within a predetermined value. As a result, the present inventors found that it is possible to form the single crystal film having an excellent crystallinity with high reproductivity if the single crystal film is formed during which the viscosity of the liquid phase is 75~95% with respect to the viscosity at which a degree of supercooling of the liquid phase is zero.

As a result, it becomes possible to form the single crystal film having a smaller half width of and X-ray rocking curve than that of the single crystal substrate, which can not be formed by the conventional method.

Moreover, the present inventors tried to form an optical waveguide on the single crystal film having the smaller half width of the X-ray rocking curve and to measure optical properties thereof. As a result, it is confirmed that an optical damage resistivity of the optical waveguide is improved drastically. Therefore, it is possible to use the optoelectric articles according to the invention as various optical devices.

Now, the half width of the X-ray rocking curve will be explained. The crystallinity of the single crystal substrate and the single crystal film can be evaluated by their half widths of the X-ray rocking curve. In general, it can be considered that the smaller the half width, the more excellent the crystallinity of the single crystal. Since this value itself varies depending upon a standard crystal etc. used in the X-ray measuring apparatus, an absolute value cannot be identified.

However, the crystallinity of the single crystal thin film produced by the liquid phase epitaxial process is strongly influenced by that of the single crystal substrate. Therefore, whether the crystallinity of the single crystal film produced is excellent or not must be judged with reference to the half width of the X-ray rocking curve of the substrate used. Particularly, since the single crystal substrate having the optical grade is produced at present by the Czochralski process, it is preferable that the half width of the X-ray rocking curve of the single crystal film is smaller than that of the optical grade single crystal substrate.

The optoelectric single crystal substrate and the optoelectric single crystal film may be formed from the same materials or may be formed from different materials. However, lattice constants of them must be close. As to the optoelectric single crystal film, it is preferred to use a single crystal of lithium niobate ($LiNbO_3$), a single crystal of lithium tantalate ($LiTaO_3$) or a single crystal of $LiNb_xO_3$ ($0<x<1$).

Heretofore, the optoelectric single crystal substrate is formed by the Czochralski process, and a single crystal substrate of lithium niobate having an optical grade with an excellent crystallinity can be obtained. However, up to now, a single crystal substrate of lithium tantalate produced by the Czochralski process has a worse crystallinity than that of the single crystal substrate of lithium niobate. Therefore, if a single crystal film is formed on the single crystal substrate of lithium tantalate having an inherently worse crystallinity, it is difficult to form a single crystal film having a more excellent crystallinity than that of the single crystal film formed on the single crystal substrate of lithium niobate having an optical grade.

Due to this reason mentioned above, it is preferred to use the single crystal substrate of lithium niobate having an optical grade. However, this problem occurs only for the Czochralski process. Therefore, in future, if the single crystal substrate of lithium tantalate having an optical grade, which has substantially the same crystallinity as that of the single crystal substrate of lithium niobate, can be obtained, it is possible to use the single crystal substrate of lithium tantalate preferably.

If the solute is one or more solutes selected from a group of lithium niobate, lithium tantalate and $LiNb_xTa_{1-x}O_3$, it is preferred to use one or more melting media selected from a group of $LiVO_3$ and $LiBO_2$. If a combination of the solute and the melting medium mentioned above is used, it is preferred that the charged composition of the melt has a ratio of solute/melting medium being 10/90 to 60/40 in terms of "mol %".

Figure 6:
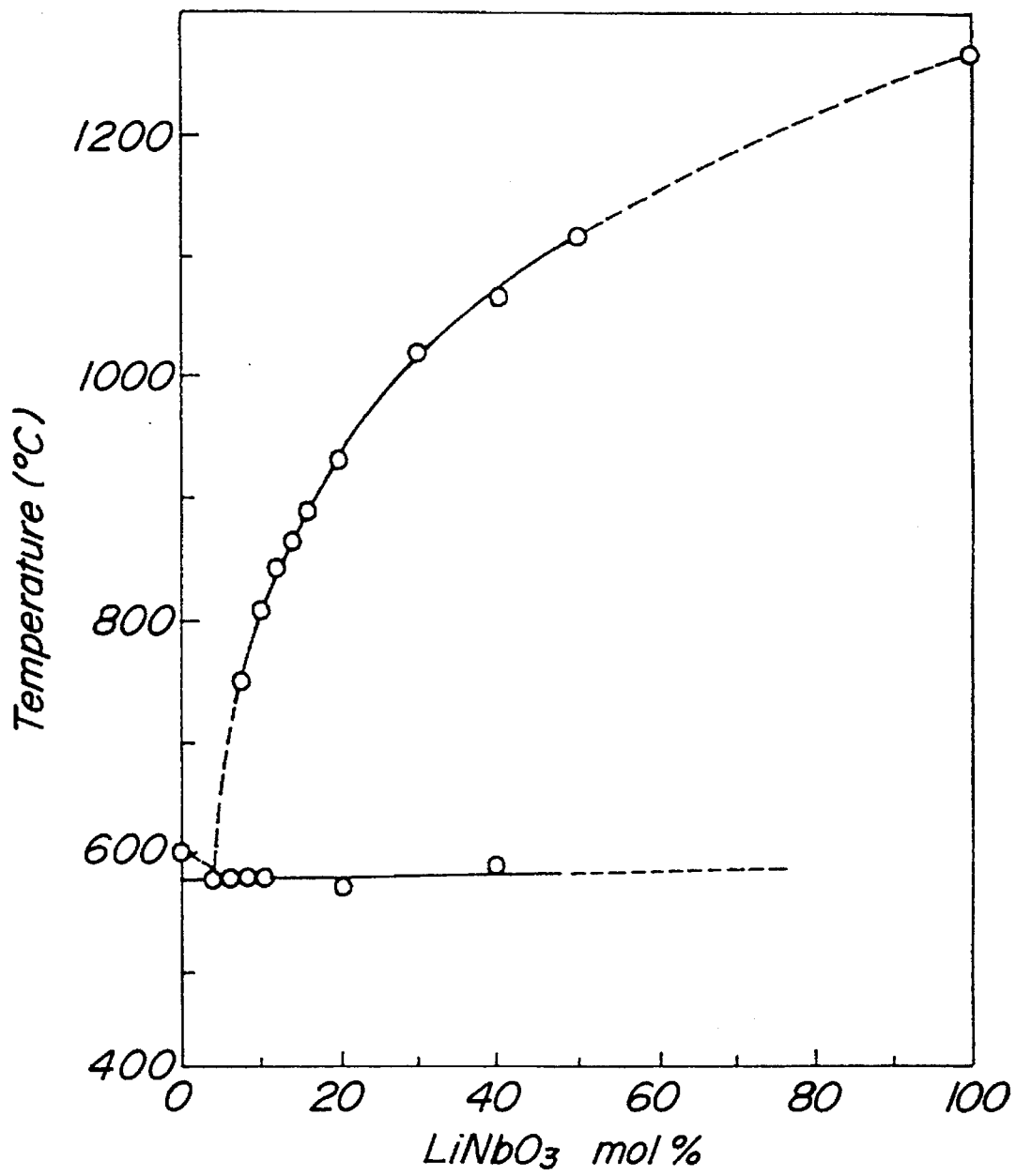
FIG. 6 is a graph schematically depicting a solubility curve of a $LiNbO_3$–$LiVO_3$ pseudo-binary system.

If the rate of the solute is less than 10 mol %, as shown in FIG. 6, the slope of the liquid phase curve becomes so great in a phase diagram of a pseudo-binary component system of solute-melting medium that the concentration of the melt largely changes owing to the growth of the film. Accordingly, it becomes difficult to stably keep the film forming condition. If the ratio of the solute is more than 60%, the saturation temperature increases. Accordingly, the film forming temperature becomes too high, and it becomes difficult to produce the single crystal film having excellent crystallinity.

Figure 5:
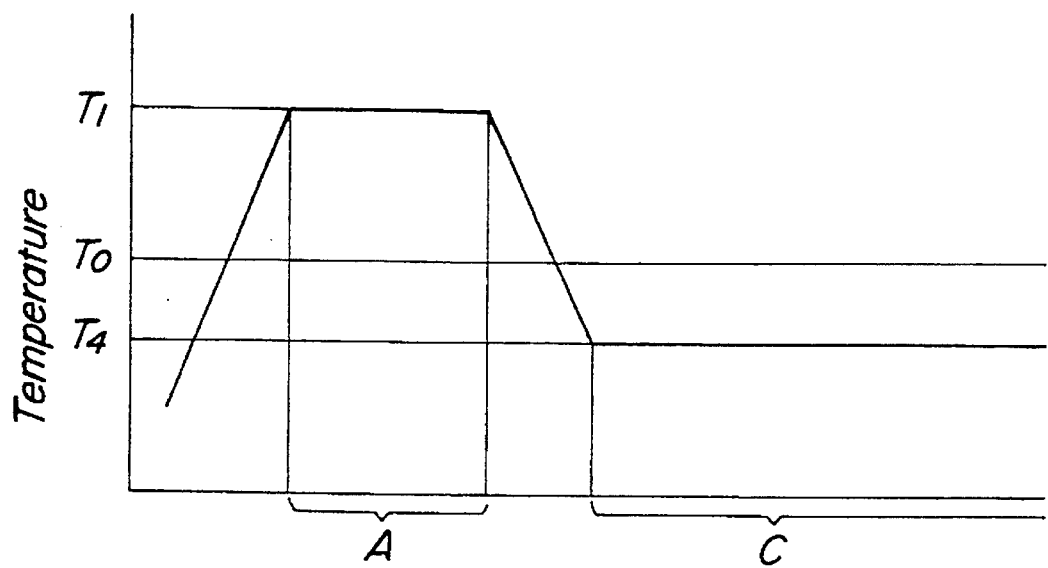
FIG. 5 is a graph schematically illustrating the temperature schedule of the melt in the liquid phase epitaxial process.

Moreover, instead of the method explained with reference to FIG. 5, the other method especially the following method can be used preferably.

Figure 3:
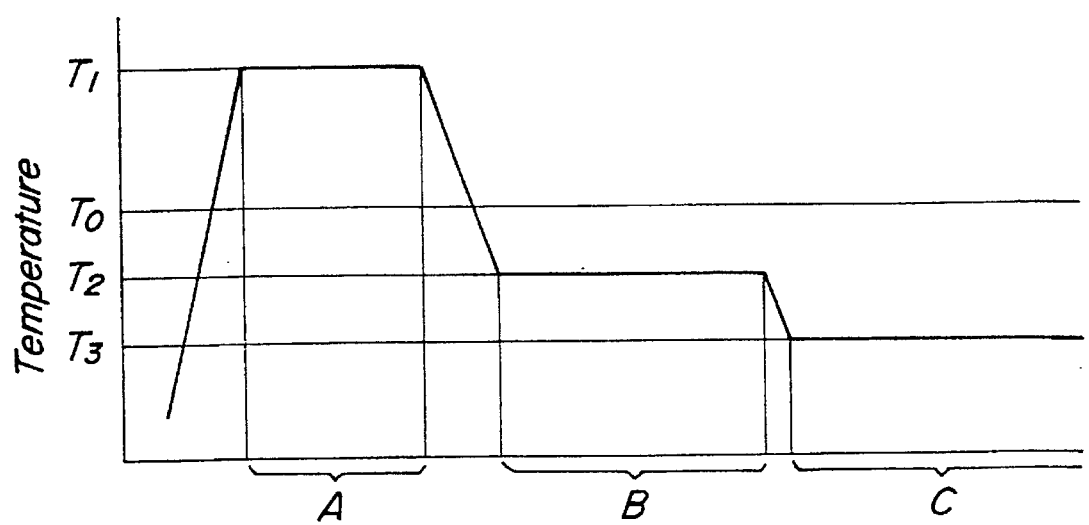
FIG. 3 is a graph schematically depicting a temperature schedule of the melt produced by a process adopted by the present inventors.

During the investigations of the liquid phase epitaxial process, the present inventors tried to investigate a process for forming the supercooling state again. Hereinafter, this process will be explained with reference to FIGS. 3 and 4. FIG. 3 is a graph schematically showing the temperature schedule of the melt in the liquid phase epitaxial process. FIGS. 4a and 4b schematically show the state of the melt in a crucible 1.

First, a solute and a melting medium are charged and mixed in the crucible 1. The saturation temperature $T_0$ of the melt is one-to-one determined by the concentration of the solute in the melt, that is, corresponding to the charged composition. This saturation temperature can be calculated, for example, from a liquid phase curve as shown in FIG. 6.

Then, while the temperature of the melt is kept at $T_1$ higher than the saturation temperature $T_0$, the solute and the melting medium are uniformly melted. In FIG. 3, "A" corresponds to the molten state. As shown in FIG. 4a, the mixture is entirely in the form of a liquid phase.

Next, the temperature of the melt is lowered to a solid phase-precipitating temperature $T_2$ lower than the saturation temperature $T_0$. In this state, the melt is first kept in an supercooled state. When the melt is kept at that temperature $T_2$ for a sufficiently long time, a solid phase comes out from the melt. In FIG. 3, "B" corresponds to a state in which the melt is kept for the precipitation of the solid phase. As shown in FIG. 4b, at that time, the melt 3 is separated into a liquid phase 4 and a solid phases 5. The solid phase 5 precipitates along a wall surface of the crucible 1.

Thereafter, the temperature of the melt is lowered to convert the liquid phase 4 to the supercooled state In FIG. 3, "C" corresponds to this supercooled state. The substrate 6 is lowered toward the liquid phase 4 in the supercooled state as shown by an arrow 7, and contacted with the liquid phase 4, thereby epitaxially growing a film of a single crystal on the substrate.

In the liquid phase 4 in the supercooled state, it is necessary to set a viscosity of the liquid phase 4 to 95~75% with respect to the viscosity at which the degree of supercooling is zero.

In this way, according to the process mentioned above, the state B in which the solid phase and the liquid phase stably co-exist is taken as a starting point. That is, the temperature $T_2$ is taken as a starting point, and the liquid phase is converted to the supercooled state by lowering the temperature in the state B to the temperature $T_3$. In this way, in the state in which the solid phase and the liquid phase coexist, the concentration of the solute in the liquid phase is kept at the saturated concentration at the holding temperature $T_2$ so long as the temperature exceeds the saturated temperature of the whole system.

For example, if the concentration of the solute in the melt decreases, the amount of the solid phase decreases at the holding temperature $T_2$, corresponding to this decreased concentration. On the other hand, if the concentration of the solute increases, the solid phase increases corresponding to the increased concentration of the solute. Therefore, the relationship between the temperature of the liquid phase and the concentration of the solute is always kept constant. Since the film forming temperature $T_3$ is as a matter of course kept constant, the difference between $T_2$ and $T_3$ (the degree of supercooling) is kept constant. Consequently, the supercooled state is completely controlled.

As a result, even if the composition of the melt changes due to repeated formation of the films onto the substrates during the actual film forming process, the supercooled state can be almost completely kept constant. Therefore, the film of the single crystal having excellent crystallinity can be produced with high reproductivity, and thus it is further preferred.

Moreover, according to the process mentioned above, it is possible to not only form the single crystal film having a constant quality with high reproductivity, but also improve the crystallinity itself of the single crystal film. This reason is not certain, but the following may be this reason.

In the conventional method, the melt is a uniform liquid phase, when the substrate contacts the melt. Therefore, just after the substrate contacts the melt, the solid phase starts to precipitate on a surface of the substrate from the liquid phase. In order to start a growing of the single crystal film, it is estimated that a relatively large nucleation energy must be needed. Since the nucleation energy is large when the film growing starts at an interface between the substrate and the film, it is understood that the crystallinity of the film is deteriorated at the interface and thus the crystallinity of the film formed on the crystallinity-deteriorated film is also deteriorated.

On the other hand, according to the process mentioned above, as shown in FIG. 4b, the solid phase 5 preliminary coexists in the melt 3 before the substrate 6 contacts the melt 3. In this state, melting and precipitation simultaneously occur at the interface between the solid phase 5 and the liquid phase 4 as viewed microscopically. Therefore, when a fresh substrate 6 is contacted with the melt 3, a film begins to be smoothly grown to produce a single crystal film having an excellent crystallinity.

In the present invention, a viscosity of the liquid phase mentioned above must be set to 75~95% with respect to the viscosity at which the degree of supercooling of the liquid phase is zero, thereby it is possible to form a single crystal film having the same or smaller half width of the X-ray rocking curve as or than that of the substrate. Particularly, the viscosity of the liquid phase is set to 75~90% with respect to the viscosity at which the degree of supercooling of the liquid phase is zero, it is possible to make the half width of the single crystal film clearly smaller than that of the substrate.

In order to control the viscosity of the liquid phase, the following methods are used preferably.

(1) If the film is repeatedly formed from the same melt, the viscosity of the melt is gradually decreased. In this case, while measuring and inspecting the viscosity of the liquid phase, a little amount of solute is gradually added in the melt, thereby the viscosity of the melt at the film forming temperature can be controlled within the range mentioned above.

(2) When a temperature of the melt is cooled down from a high temperature higher than the saturation temperature to the film forming temperature, a cooling rate of the melt is made larger, thereby the viscosity of the melt at the film forming temperature can be decreased. On the other hand, if the cooling rate of the melt is made smaller, the viscosity of the melt at the film forming temperature can be increased. In this case, while measuring and inspecting the viscosity of the liquid phase, the cooling rate is varied, thereby the viscosity of the melt at the film forming temperature can be controlled within the range mentioned above.

Hereinafter, experimental results will be explained.

Experiment 1: Relation between a measuring temperature and a viscosity of a melt at which a degree of supercooling is zero First, an experiment about a viscosity of a melt will be explained. At first, with respect to the melt made of 20 mol % $LiNb_3$ (solute)–80 mol % $LiVO_3$ (melting medium), the viscosity of the melt was measured in an air by using "REOTRONIC II" (Tokyo Kogyo Co., Ltd.) in which the viscosity is measured by a rotation method. The viscosity of $LiVO_3$ itself was also measured in the same manner.

Then, the melt was heated to 1160° C. in the crucible and was kept for 12 hours at 1160° C. After that, the melt was cooled down to a measuring temperature. After the melt becomes stable at the measuring temperature, the viscosity of the melt was measured. FIG. 1 is a graph showing a relation between the viscosity and the temperature with respect to the melt made of 20 mol % $LiNbO_3$–80 mol % $LiVO_3$ (represented by □ and the $LiVO_3$ (represented by ○).

As shown in FIG. 1, in a high temperature region higher than about 950° C., the viscosity of the melt of $LiNbO_3$–$LiVO_3$ and the viscosity of $LiVO_3$ are very close. However, a slope of the viscosity of the melt is drastically changed at about 950° C. That is to say, in a temperature region lower than about 950° C., an increasing amount of the viscosity becomes larger in response to a temperature descent. In this case, a temperature of about 950° C. represents the saturation temperature of the melt, and the viscosity of the melt at this saturation temperature is about 17.0 mPa·sec.

In the temperature range lower than about 950° C., the viscosity of the melt of $LiNbO_3$–$LiVO_3$ is larger than that of $LiVO_3$. This is because a little amount of solid phase is precipitated in a low temperature lower than the saturation temperature and condensations or associations are generated in the melt. These values in this temperature region represent the viscosity at which the degree of supercooling is zero.

Experiment 2: Relation between a cooling rate to the measuring temperature and a viscosity Next, the present inventors investigated the relation between the cooling rate from a high temperature to the measuring temperature and the viscosity of the melt at the measuring temperature. At first, the melt made of 20 mol % $LiNbO_3$–80 mol % $LiVO_3$ was heated to 1160° C. and was kept for 12 hours at 1160° C. Then, the melt was cooled down to 980° C. with a temperature descending rate of 120° C./hour and was kept for 12 hours at 980° C. After that, the melt was further cooled down to 850° C. In this case, a temperature descending rate from 980° C. to 850° C. was varied.

In the case that the melt was cooled from 980° C. to 850° C. for 4 hours, the viscosity of the melt showed the same result as that of FIG. 1. In the case that the melt was cooled from 980° C. to 850° C. for 2 hours, the viscosity was gradually increased till about 897° C., and an increasing amount of the viscosity was larger at a temperature lower than about 897° C. That is to say, an inflection point of a viscosity curve exists at about 897° C. In the case that the melt was cooled from 980° C. to 850° C. for 1 hour, the viscosity was gradually increased till about 892° C., and an increasing amount of the viscosity was larger at a temperature lower than about 892° C. In the case that the melt was cooled from 980° C. to 850° C. for 15 minutes, the viscosity was gradually increased till about 867° C., and an increasing amount of the viscosity was larger at a temperature lower than about 867° C.

As mentioned above, when the melt is cooled down from a high temperature to the measuring temperature lower than the saturation temperature (about 950° C.) with various cooling rates, the viscosity of the liquid phase in the supercooling state is varied, even if the composition of the melt and the measuring temperature are same. Particularly, if the cooling rate becomes larger, the temperature, at which the viscosity is drastically increased, is shifted toward a temperature lower than the saturation temperature (950° C.).

Moreover, as the cooling rate becomes larger, the viscosity at respective film forming temperatures becomes smaller.

In this case, the supercooling state of the liquid phase is unstable, and thus the viscosity is increased if maintained at the film forming temperature.

Figure 2:
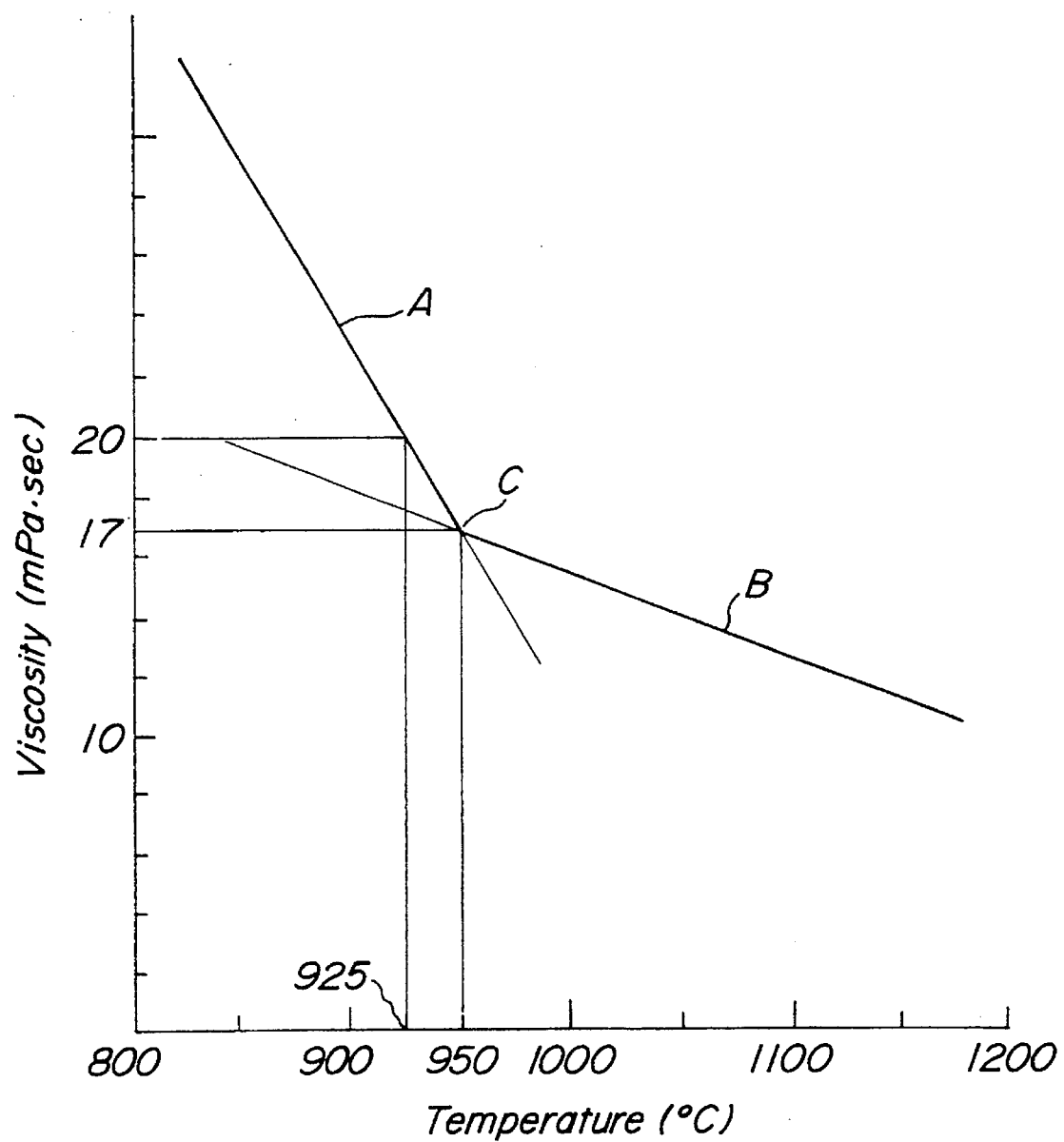
FIG. 2 is a graph illustrating the relation shown in FIG. 1 in a partly enlarged state.

FIG. 2 is a graph showing an enlarged part of the viscosity curve shown in FIG. 1. In a temperature region higher than about 950° C., a line B is straight. At a temperature of about 950° C. (point C), the viscosity is about 17 mPa·sec. In a temperature region lower than about 950° C., a slope of a line A is larger than that of the line B.

Here, it is assumed that a film is formed at 925° C. The viscosity of the melt, in which the degree of supercooling is zero, is 20 mPa·sec at the film forming temperature of 925° C. In the liquid phase epitaxial process, the melt is generally maintained at a temperature sufficiently higher than 950° C., and then cooled down to 925° C. In this case, if the temperature is decreased with a sufficiently slow rate, the viscosity of the melt at 925° C. is increased to 20 mPa·sec. However, in the present invention, the viscosity of the melt at 925° C. is controlled in a range of 15~19 mPa·sec preferably 15~18 mPa·sec by adjusting the cooling rate.

Experiment 3: Variation of a viscosity in a repeated film forming process

The melt made of 20 mol % $LiNbO_3$–80 mol % $LiVO_3$ was used. First, the melt was agitated for more than 3 hours at a temperature of 1100°~1300° C. to be a sufficiently uniform state. Then, the melt was cooled down to 980° C. and maintained stably at 980° C. As to the optoelectric single crystal substrate, a Z-cut single crystal substrate of lithium niobate of an optical grade having a thickness of 1 mm was used.

The single crystal substrate was supported horizontally by a holder made of platinum in such a manner that a -Z plane of the single crystal substrate is lowered, and was moved downward till a position about 5 mm above a liquid surface of the melt with a descending rate of 1 mm/minute, while rotating it at 20 rpm. Then, the single crystal substrate was sufficiently preheated so that a temperature of the single crystal substrate was the same as that of the melt.

Then, the melt is cooled down to 925° C. to make it in the supercooling state. Then, the single crystal substrate was moved down with a descending speed of 5 mm/minute, and the substrate contacted the melt, so that the film was formed. A cooling rate during which the melt is cooled down to 925° C. was 60° C./minute.

After the film was formed, the single crystal substrate was moved upward with an ascending rate of 100 mm/minute so as to separate it from the melt. Then, the single crystal substrate was rotated for 30 seconds at 800 rpm so as to remove the melt remaining on the substrate. After that, the substrate was slowly cooled down to the room temperature, and then the melt remaining on the substrate yet was removed completely by washing.

The film forming step mentioned above was performed repeatedly in the number of times shown in Table 1, and the viscosity of the melt at 925° C. and the half width of the X-ray rocking curve were measured. The half width of the X-ray rocking curve was measured with use of a reflection at a (0012) plane by a double-crystal method. A CuKα line was used as an incident X-ray, and a (422) plane of a GaAs single crystal was used as a monochrometer. Moreover, the half width of the X-ray rocking curve of the single crystal film was compared with that of the substrate previously measured. The half width of the X-ray rocking curves of each of the single crystal substrates of lithium niobate having an optical grade used by the inventors was 6.8~6.9 (arc sec), and these substrates were taken as standards for crystallinity of the single crystal substrate of lithium niobate.

TABLE 1

| Number of times of film forming | Film forming temperature (°C.) | Viscosity (mPa · sec) | Half width value (arc sec) |
|---|---|---|---|
| 1 | 925 | 17.0 | 5.9 |
| 10 | 925 | 16.9 | 6.0 |
| 20 | 925 | 16.0 | 6.1 |
| 50 | 925 | 15.0 | 6.2 |
| 100 | 925 | 14.3 | 7.8 |
| 200 | 925 | 10.9 | 15.4 |
| 300 | 925 | 9.5 | 20.1 |

As can be understood from Table 1, if the number of times of the film forming is increased, the viscosity of the melt in the supercooling state is decreased extraordinarily. In addition, the half width of the X-ray rocking curve of the single crystal film is deteriorated extraordinarily. However, since an amount of solute to be used for the film forming is small, it is understood that this is due to an instability of the melt in the supercooling state.

Experiment 4: Control of a viscosity and influence for film qualities by an addition of solute As is the same as the experiment 3, a single crystal film of lithium niobate was formed from the melt made of 20 mol % $LiNbO_3$–80 mol % $LiVO_3$. In this case, the film forming step shown in the experiment 3 was performed repeatedly in the number of times shown in Table 2. Moreover, a little amount of solute was gradually added in the melt, while measuring and inspecting the viscosity of the melt at 925° C., so as to control the viscosity of the melt at 925° C. to be 17.0 mPa·sec. Then, a film growing speed of the single crystal film and a half width of an X-ray rocking curve were measured. The measured results are shown in Table 2.

TABLE 2

| Number of times of film forming | Film-forming temperature (°C.) | Viscosity (mPa · sec) | Film growing speed (µm/min.) | Half width value (arc sec) |
|---|---|---|---|---|
| 1 | 925 | 17.0 | 1.0 | 5.9 |
| 10 | 925 | 17.0 | 1.0 | 6.0 |
| 20 | 925 | 17.0 | 1.0 | 6.0 |
| 50 | 925 | 17.0 | 1.0 | 5.9 |
| 100 | 925 | 17.0 | 1.0 | 5.9 |
| 200 | 925 | 17.0 | 1.0 | 6.0 |

As can be understood from Table 2, even in the case that the film forming is performed repeatedly, it is possible to make the film growing speed and the half width constant, if a little amount of solute is gradually added in the melt so as to control the viscosity of the melt at 925° C. to 17.0 mPa·sec. In addition, it is possible to form the film with excellent qualities having a half width smaller than that of the single crystal substrate of lithium niobate.

Experiment 5: Control of a viscosity and influence for film qualities by an adjustment of cooling rate As is the same as the experiment 3, a single crystal film of lithium niobate was formed. In this case, the melt made of 20 mol % $LiNbO_3$–80 mol % $LiVO_3$ was agitated for more than 3 hours at 1300° C. to be a sufficiently uniform state, and then was cooled down to 1100° C. at which it is maintained stably. The viscosity of the melt at 1100° C. was 11.0 mPa·sec.

Then, the melt was cooled down to 925° C. to make it in the supercooling state. After that, the single crystal substrate was moved downward with a descending rate of 5 mm/minute, and the substrate contacted with a surface of the melt to form a film. A cooling rate, during which the melt was cooled to 925° C., was varied in a range of 3° C./hour~600° C./hour, thereby the viscosity of the melt at 925° C. was varied as shown in Table 3. Then, as is the same as the experiment 3, a single crystal film of lithium niobate was formed, and a half width of an X-ray rocking curve was measured. The measured results are shown in Table 3.

TABLE 3

| Cooling rate (°C./hour) | Film forming temperature (°C.) | Viscosity (mPa · sec) | Half width value (arc sec) |
|---|---|---|---|
| 600 | 925 | 12.0 | 13.2 |
| 300 | 925 | 14.0 | 7.9 |
| 120 | 925 | 15.0 | 5.8 |
| 60 | 925 | 16.0 | 5.9 |
| 30 | 925 | 17.0 | 5.9 |
| 15 | 925 | 18.0 | 5.9 |
| 6 | 925 | 19.0 | 6.7 |
| 3 | 925 | 20.0 | 18.2 |

As can be understood from Table 3, if the viscosity of the melt at the film forming temperature is set in a range of 15.0~19.0 mPa·sec, i.e., if the viscosity of the melt is set to 75~95% with respect to the viscosity of 20.0 mPa·sec at which the degree of supercooling is zero, it is possible to control the half width of the single crystal film to the same or less than that of the single crystal substrate. Moreover, if the viscosity of the melt at the film forming temperature is set to 75~90% with respect to the viscosity at which the degree of supercooling is zero, it is possible to control the half width of the single crystal film to clearly less than that of the single crystal substrate.

The reason of obtaining these effects is not clear, but it is estimated that, if the value mentioned above is not less than 95%, the film forming speed is decreased and thus the film forming state becomes unstable. Moreover, it is estimated that, if the value mentioned above is not more than 75%, a flowability is yet maintained high and thus the solid phase is not precipitated stably.

As mentioned above, according to the invention, when the optoelectric single crystal film is formed on the optoelectric single crystal substrate by the liquid phase epitaxial process, it is possible to for the single crystal film having an excellent crystallinity with high reproducibility. Particularly, it is possible to form the single crystal film having the same or more crystallinity as or than that of the single crystal substrate.

What is claimed is:

1. A process for producing an optoelectric article, comprising the steps of exposing an optoelectric single crystal substrate to a liquid phase in a supercooled state, said liquid phase including a solute and a melting medium, and forming an optoelectric single crystal film on the substrate by liquid phase epitaxial process, wherein a visocosity of said liquid phase in said supercooled state is 75%~95% of a viscosity of said liquid phase in an non-supercooled state.

2. The process according to claim 1, wherein said viscosity of said liquid phase in said supercooled state is 75%~95% of the viscosity of said liquid phase in a non-supercooled state.

3. The process according to claim 1, wherein said melt comprises 20 mol % $LiNbO_3$–80 mol % $LiVO_3$.

4. The process according to claim 1, wherein said optoelectric single crystal substrate comprises at least one single crystal selected from the group consisting of a single crystal of lithium niobate, lithium tantalate and $LiNb_xTa_{1-x}O_3$ (0<x<1).

5. The process according to claim 1, wherein said optoelectric single crystal film comprises at least one single crystal selected from the group consisting of a single crystal of lithium niobate, lithium tantalate and $LiNb_xTa_{1-x}O_3$ (0<x<1).

6. The process according to claim 1, wherein said viscosity of said liquid phase in said supercooled state is controlled adding solute.

7. The process according to claim 1, wherein said viscosity is of said liquid phase in said supercooled state is controlled by adjusting a cooling rate of said melt.

\* \* \* \* \*